(12) United States Patent
Wey

(10) Patent No.: US 9,378,960 B2
(45) Date of Patent: Jun. 28, 2016

(54) METHOD AND STRUCTURE FOR IMPROVED FLOATING GATE OXIDE INTEGRITY IN FLOATING GATE SEMICONDUCTOR DEVICES

(75) Inventor: Yihguei Wey, Vancouver, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

(21) Appl. No.: 13/092,043

(22) Filed: Apr. 21, 2011

(65) Prior Publication Data

US 2012/0270387 A1 Oct. 25, 2012

(51) Int. Cl.
*H01L 21/336* (2006.01)
*H01L 21/28* (2006.01)
*H01L 29/423* (2006.01)

(52) U.S. Cl.
CPC .... *H01L 21/28114* (2013.01); *H01L 21/28273* (2013.01); *H01L 29/42376* (2013.01)

(58) Field of Classification Search
None
See application file for complete search history.

(56) References Cited

U.S. PATENT DOCUMENTS

| | | | | |
|---|---|---|---|---|
| 2003/0235951 A1* | 12/2003 | Hashimoto | ................... | 438/257 |
| 2004/0121573 A1* | 6/2004 | Chu et al. | ....................... | 438/594 |
| 2005/0287793 A1* | 12/2005 | Blanchet et al. | ............... | 438/629 |
| 2007/0146208 A1* | 6/2007 | Lee et al. | ............... | 343/700 MS |
| 2009/0200595 A1* | 8/2009 | Nagai | ........................... | 257/316 |

\* cited by examiner

*Primary Examiner* — Zandra Smith
*Assistant Examiner* — Andre' C Stevenson
(74) *Attorney, Agent, or Firm* — Duane Morris LLP

(57) ABSTRACT

Methods for forming floating gate transistors provide for using a self-aligned plug formed over a floating gate electrode without use of an additional photolithography operation. The plug is centrally disposed and is formed and aligned using spacers. The spacers are formed alongside edges of a patterned sacrificial, oxidation resistant layer that includes an opening that defines the floating gate region. The plug may be formed of a silicon material and which becomes oxidized along with the floating gate such that the plug eventually forms part of the floating gate electrode or the plug may be formed of a nitride or other oxidation resistant material to retard or prevent oxidation in the central portion of the floating gate in which the plug is aligned.

18 Claims, 5 Drawing Sheets

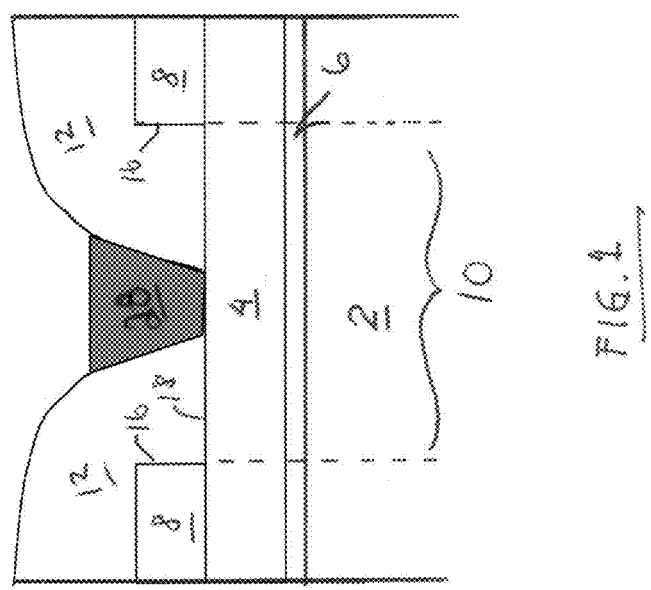

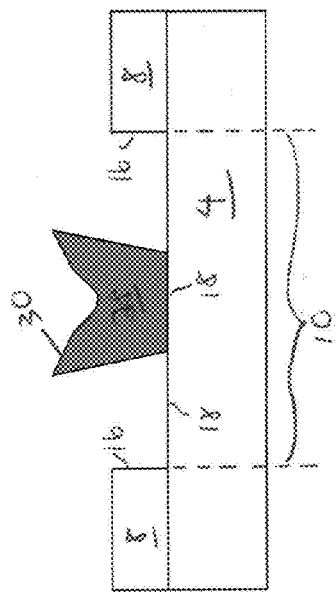
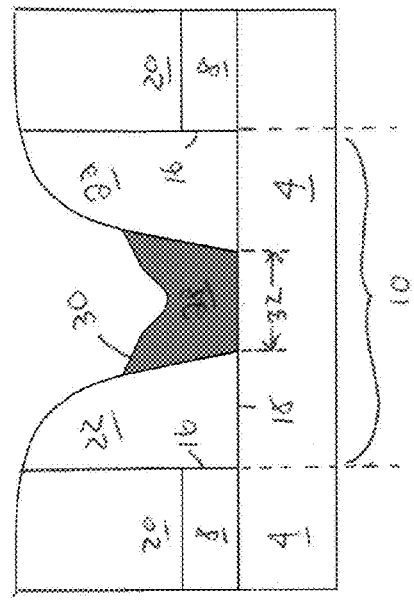
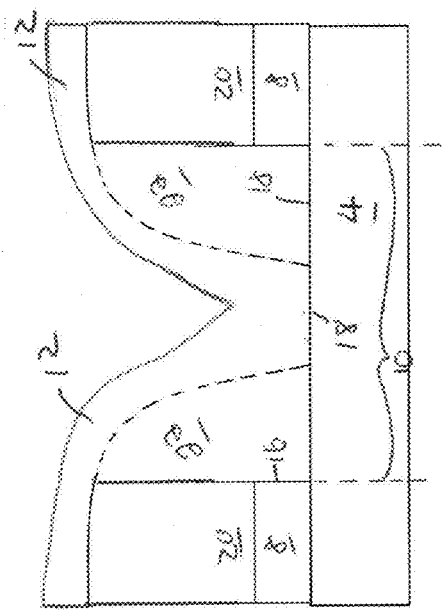
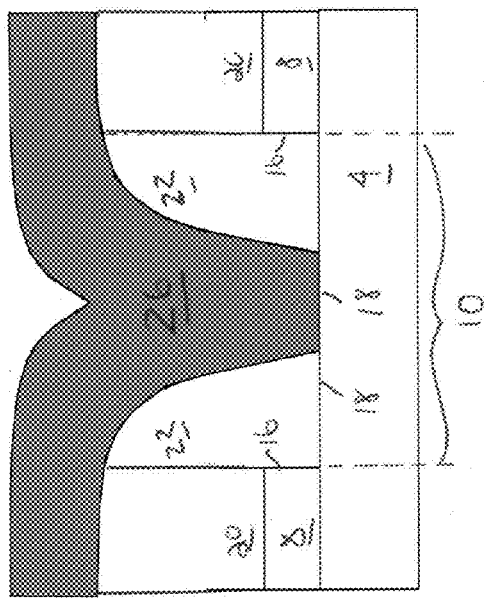

METHOD AND STRUCTURE FOR IMPROVED FLOATING GATE OXIDE INTEGRITY IN FLOATING GATE SEMICONDUCTOR DEVICES

TECHNICAL FIELD

The present disclosure relates to semiconductor floating gate transistors and methods for making the same.

BACKGROUND

A floating gate transistor is a field effect transistor having a structure similar to a conventional MOSFET (metal oxide semiconductor field effect transistor). Floating gate transistors are used in flash memory devices that typically store information in an array of memory cells made using the floating gate transistors. Flash memory devices are non-volatile storage devices that can be electrically erased and reprogrammed and they are commonly used in memory cards, USB flash drives and solid-state drives for general storage and transfer of data between computers and other digital products.

Floating gate MOSFETs are distinguished from conventional MOSFETs because the floating gate transistor includes two gates instead of one. In addition to an upper control gate, a floating gate transistor includes an additional floating gate beneath the control gate and above the transistor channel but completely electrically isolated by an insulating layer such as an oxide layer that completely surrounds the floating gate. This electrically isolated floating gate creates a floating node in DC with a number of inputs or secondary gates such as the control gate, formed above the floating gate and electrically isolated from it. These secondary gates or inputs are only capacitively connected to the floating gate. Because the floating gate is completely surrounded by highly resistive material, i.e. the insulating layer, any charge placed on the floating gate is trapped there and the floating gate remains unchanged for long periods of time until the floating gate MOSFET is erased. Unless erased, the floating gate will not discharge for many years under normal conditions. Fowler-Nordheim Tunneling or other Hot-Carrier injection mechanisms may be used to modify the amount of charge stored in the floating gate, e.g. to erase the floating gate. The erase operation is therefore critical to the operation of floating gate transistors.

The default state of an NOR ("Not Or" electronic logic gate) flash cell is logically equivalent to a binary "one" value because current flows through the channel under application of an appropriate voltage to the control gate when charge is stored in the floating gate. Such a flash cell device can be programmed or set to binary "zero" by applying an elevated voltage to the control gate.

To erase such a flash cell, i.e. resetting it to the "one" state, a large voltage of the opposite polarity is applied between the control gate and the source causing electrons to exit the floating gate through quantum tunneling. In this manner, the electrical charge is removed from the floating gate. This tunneling necessarily takes place through the inter-gate dielectric formed between the floating gate and the control gate. The inter-gate dielectric extends over the floating gate including over the edge of the floating gate and the tunneling typically takes place through the inter-gate dielectric at the edge of the floating gate. The configuration, size and shape of the floating gate and the inter-gate dielectric have a significant impact on tunneling and the ability to erase the flash cell.

The shape and thickness of the inter-gate dielectric is critical to the tunneling and overall operation of the floating gate transistor. The shape and integrity of the floating gate is also critical to the tunneling and overall operation of the floating gate transistor. When the inter-gate dielectric formation process includes oxidizing the floating gate, i.e. forming an oxide layer at the expense of the floating gate, the floating gate can be completely consumed and this destroys the structural integrity and the operational characteristics of the floating gate and therefore the floating gate transistor and the flash cell that includes the floating gate transistor. This can destroy device functionality. Conventional methods and structures for forming floating gate transistors tend to be uncontrolled and to consume too much of the floating gate, and can, at times, consume the entire thickness of the floating gate.

Conventional methods and structures for forming floating gate transistors face challenges to address the above and other concerns and to prevent the above shortcomings and limitations.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 1 is a cross-sectional view showing an exemplary self-aligned plug formed over a floating gate according to an aspect of the disclosure;

FIGS. 2A-2E are cross-sectional views illustrating a sequence of processing operations used to form a self-aligned plug over a floating gate according to an aspect of the disclosure;

DETAILED DESCRIPTION

Figure 2A:
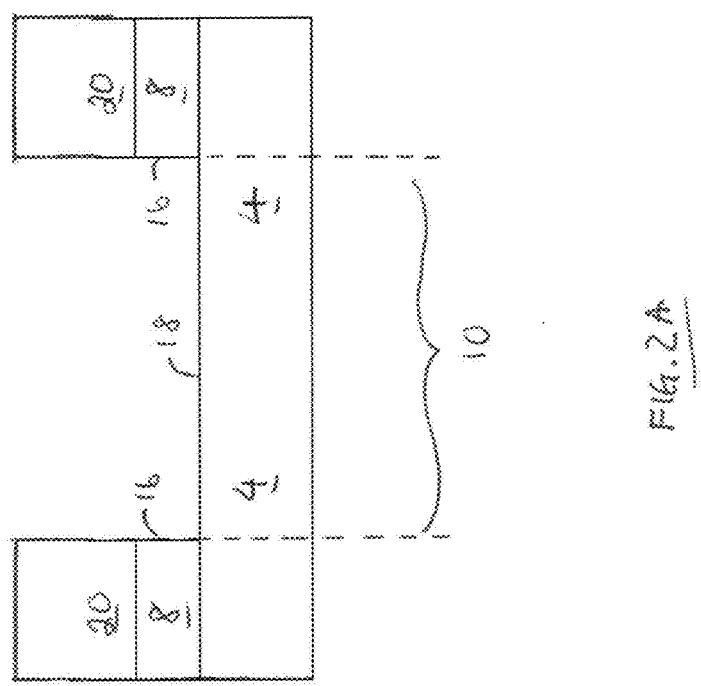

The disclosure provides for forming floating gate transistors. The floating gate transistors may be used in flash memory devices or other semiconductor devices. The floating gate transistor includes a silicon floating gate disposed over a gate dielectric. Before the floating gate is oxidized to form an inter-gate dielectric over the floating gate, a silicon or nitride plug is formed over the silicon floating gate. The plug prevents over-oxidation which can completely consume the silicon gate especially in central portions where oxidation is most aggressive using conventional methods. An additional photomask step is not required.

According to various exemplary embodiments, spacers are utilized in conjunction with the topography of the patterned layer or layers that identify the floating gate region, to determine the position of the self-aligned plugs and the plugs are formed and aligned without the use of an additional photolithography operation.

The methods and structures provided in the present disclosure may be used in the fabrication of various semiconductor devices including embedded flash memory products utilizing 0.35 um, 0.25 um, and 0.18 um technologies.

FIG. 1 is a cross-sectional view showing an exemplary structure illustrating a plug formed over a floating gate as according to various exemplary embodiments of the disclosure. FIG. 1 represents one stage in the sequence of processing operations that are shown in more detail FIGS. 2A-2E, FIGS. 3A-3B and FIGS. 4A-4B. Substrate 2 includes silicon layer 4 formed thereover. Substrate 2 may be a silicon substrate or may be formed of other suitable semiconductor or other materials used as substrates in the semiconductor manufacturing industry. Silicon layer 4 may be polysilicon, silicon-germanium, or other silicon-containing semiconductor materials according to various exemplary embodiments. According to the embodiment in which silicon layer 4 is polysilicon, the polysilicon may be doped or undoped. Interposed between silicon layer 4 and substrate 2 is gate dielectric 6. Gate dielectric 6 may be an oxide such as silicon dioxide, low or high-k dielectric materials, or other suitable gate dielectric materials.

Patterned sacrificial layer 8 is formed over silicon layer 4 and may advantageously be silicon nitride, but other sacrificial materials such as silicon oxynitride, may be used in other exemplary embodiments. Patterned sacrificial layer 8 is advantageously formed of an oxidation resistant material. Patterned sacrificial layer 8 is patterned to include an opening that defines floating gate region 10. Floating gate region 10 may serve as the gate region for a floating gate transistor to be formed using subsequent processing operations.

Spacer dielectric layer 12 is formed over patterned sacrificial layer 8 and within floating gate region 10, in particular on surface 18 of silicon layer 4 and alongside sidewalls 16 of patterned sacrificial layer 8. Within floating gate region 10, spacer dielectric layer 12 forms spacers and the procedure for forming such spacers will be described infra. Plug 28 is disposed between the spacers of spacer dielectric layer 12, and on surface 18 of silicon layer 4 in floating gate region 10. Plug 28 may be formed of silicon, silicon nitride, or other materials as will be described in further detail infra.

FIGS. 2A-2E are cross-sectional views illustrating a sequence of processing operations used to form an inter-gate dielectric while maintaining the integrity of the silicon gate, according to an aspect of the disclosure. Although the figures illustrate an exemplary embodiment for forming a single floating gate transistor, the disclosed process provides for simultaneously forming a plurality of such transistors including two floating gate transistors in close proximity to form a split gate flash cell device.

In one exemplary embodiment, the floating gate transistor formed in floating gate region 10 may be formed as part of a split gate flash cell device that includes two floating gate transistors formed over substrate 2 with each floating gate transistor being at least partially formed over a common source region.

FIG. 2A shows previously-described silicon layer 4 and patterned sacrificial layer 8 defining floating gate region 10. Silicon layer 4 is formed over substrate 2 and on gate dielectric 6 but these subjacent features are not illustrated in FIGS. 2A-2E. According to one advantageous embodiment, patterned sacrificial layer 8 may be silicon nitride and may include a thickness of about 800 angstroms and in other exemplary embodiments, patterned sacrificial layer 8 may include a thickness ranging from about 400 to 1200 angstroms but still other thicknesses may be used in other exemplary embodiments. Further patterned layer 20 is optional and may be a TEOS, tetraethyl orthosilicate, layer or may be formed of other dielectric or other materials. Further patterned layer 20 may include a thickness of 1800 angstroms in one exemplary embodiment or a thickness within the range of 400-2200 angstroms or advantageously within the range of 1400-2200 angstroms, in other exemplary embodiments, but other thicknesses may be used in other embodiments.

Further patterned layer 20 includes the same pattern as patterned sacrificial layer 8 and the two layers may be patterned using one photolithography operation, according to one exemplary embodiment. Further patterned layer 20 may be advantageously utilized and the thicknesses of patterned sacrificial layer 8 and further patterned layer 20 selected, to adjust the topography needed for subsequently forming spacers and then a plug in floating gate region 10. In other exemplary embodiments, further patterned layer 20 may not be utilized. Floating gate region 10 may include a width, i.e. the distance between opposed sidewalls 16, of about 2800 angstroms in one exemplary embodiment. In other exemplary embodiments, floating gate region 10 may include a width ranging from about 1800 angstroms to about 4000 angstroms but these are intended to be exemplary only and other widths may be utilized in other exemplary embodiments.

FIG. 2B shows the structure of FIG. 2A after spacers have been formed within floating gate region 10 and along opposed sidewalls 16. Spacer dielectric layer 12 may be a TEOS material according to one exemplary embodiment, but other dielectric materials may be used according to other exemplary embodiments. Spacer dielectric layer 12 may be a composite layer of TEOS and HTO, high temperature oxide, in other exemplary embodiments and most advantageously according to the exemplary embodiment in which optional further patterned layer 20 is present and is also formed of TEOS. Dielectric layer 12 is formed over patterned sacrificial layer 8, in particular spacer dielectric layer 12 is formed on further patterned layer 20 and within floating gate region 10. Spacer dielectric layer 12 forms spacers (indicated by dashed lines) 22 along sidewalls 16 within floating gate region 10. According to various exemplary embodiments, spacer dielectric layer 12 may be formed as a blanket film that includes a greater thickness than shown in FIG. 2B, then etched in a blanket anisotropic etching operation to form spacers 22 and expose portions of surface 18 in floating gate region 10. According to one exemplary embodiment, spacer dielectric layer 12 may include an initial bulk thickness of about 1000-3000 angstroms and then about 1000-2000 angstroms of the initial thickness may be removed by the anisotropic etching process to produce the structure shown in FIG. 2B including spacers 22, though these numerical values are exemplary only.

Plug material layer 26 is then formed over the structure shown in FIG. 2B, and is illustrated in FIG. 2C. Plug material layer 26 may be a silicon layer such as but not limited to polysilicon or it may be a nitride or other oxidation resistant material. Still other plug materials may be used in other exemplary embodiments. According to one exemplary embodiment, plug material layer 26 may include a thickness of about 800 angstroms but according to other exemplary embodiments, plug material layer 26 may include a thickness ranging from about 500 angstroms to about 2000 angstroms. Plug material layer 26 plugs the opening between spacers 22 and contacts surface 18 of silicon layer 4. The thickness of plug material layer 26 is chosen in conjunction with the dimensions and the topography of the structure shown in FIG. 2B. The location at which plug material layer contacts surface 18 of silicon layer 4 is determined by spacers 22.

A selective blanket etching operation is then used to etch plug material layer 26 and to produce the structure shown in FIG. 2D. Various suitable selective etching operations and which are anisotropic in nature, may be used. Portions of plug material layer 26 are removed to produce plug 28 having top surface 30. Plug 28 fills the gap between opposed spacers 22. Self-aligned plug 28 is centrally disposed within floating gate region 10 and may include a width 32 at its base that is about ⅓ the width of floating gate region 10 in one exemplary embodiment. In other exemplary embodiments, width 32 of the base of plug 28 may be about 0.2 to 0.8 times the width of floating gate region 10.

Spacer dielectric layer 12 is removed using a selective blanket etch which may be a plasma etch or a wet stripping operation, to produce the structure shown in FIG. 2E. Plug 28 may include a height of about 800 angstroms to about 1200 angstroms in some exemplary embodiments, but other heights may be used in other exemplary embodiments. According to exemplary embodiments in which further patterned layer 20 is utilized, this layer may also be removed in the etching/stripping operation used to remove spacer dielectric layer 12 to produce the structure shown in FIG. 2E. An oxidation operation will be carried out on the structure shown in FIG. 2E to oxidize upper portions of silicon layer 4 in floating gate region 10. Patterned sacrificial layer 8, which advantageously may be silicon nitride, is oxidation resistant, thereby enabling a LOCOS, local oxidation of silicon, operation to be carried out to selectively oxidize portions of silicon layer 4 not covered by patterned sacrificial layer 8.

Figure 3B:
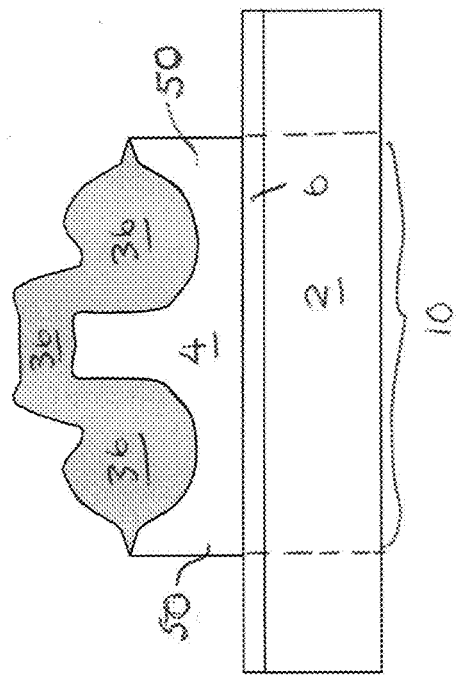
FIGS. 3A and 3B are cross-sectional views illustrating the sequence of processing operations performed on the structure of FIG. 2E according to the exemplary embodiment in which the plug is a silicon material.
Figure 3A:
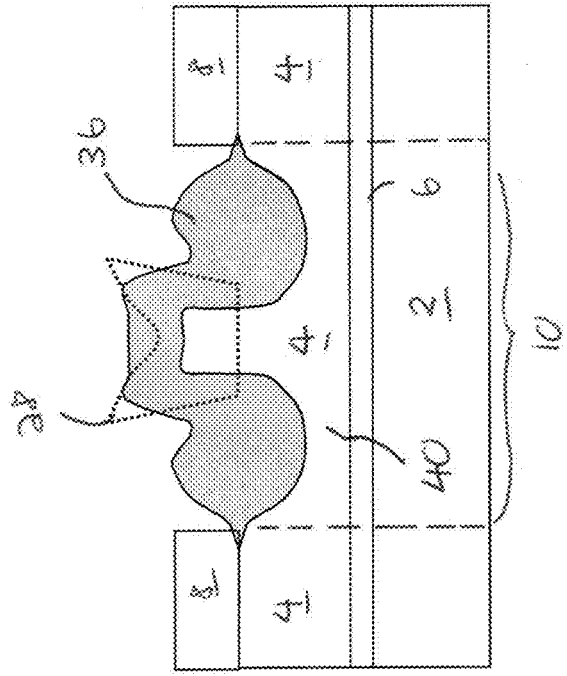

FIGS. 3A and 3B illustrate an exemplary embodiment in which plug 28 is a silicon material such as polysilicon or another material that will be oxidized during a thermal oxidation operation.

FIG. 3A shows the structure of FIG. 2E after a thermal oxidation operation has been carried out. The LOCOS operation may use various oxidation parameters and conditions depending on thickness of oxide desired, composition of silicon layer 4 and the like. Patterned sacrificial layer 8 prevents oxidation of silicon layer 4 in regions outside floating gate region 10. Oxide 36 is formed on silicon layer 4. According to one advantageous embodiment, both silicon layer 4 and plug 28 are formed of polysilicon. Former plug 28 is outlined in dashed lines in FIG. 3A to show the former position of self-aligned plug 28. Both silicon layer 4 and plug 28 (as shown in FIG. 2E) which is a silicon material in the illustrated embodiment of FIG. 3A, are oxidized. In the illustrated embodiment, oxide 36 includes a non-uniform thickness with a central thickness being less than a thickness on other portions. Gate structure 40 formed from silicon layer 4 and former plug 28 has a greater thickness in a central portion thereof. This is intended to be exemplary only and in other exemplary embodiments, the thickness, width and composition of plug 28 may be chosen to produce an essentially uniform oxide thickness across gate structure 40 and to yield gate structure 40 having a substantially uniform thickness throughout floating gate region 10.

One aspect of the disclosure provides for the oxidation of silicon layer 4 and silicon-material plug 28, to produce a gate structure 40 with a relatively uniform inter-gate dielectric thereover and the floating gate electrode formed from gate structure 40 having a maximum thickness in the central portion of floating gate region 10.

FIG. 3B shows the structure of FIG. 3A after patterned sacrificial layer 8 and silicon layer 4 have been removed from areas outside of floating gate region 10 to produce floating gate electrode 50. Conventional or other methods may be used. Oxide 36 may serve as an inter-gate dielectric between floating gate electrode 50 and a control gate to be subsequently formed over the structure shown in FIG. 3B.

Figure 4A:
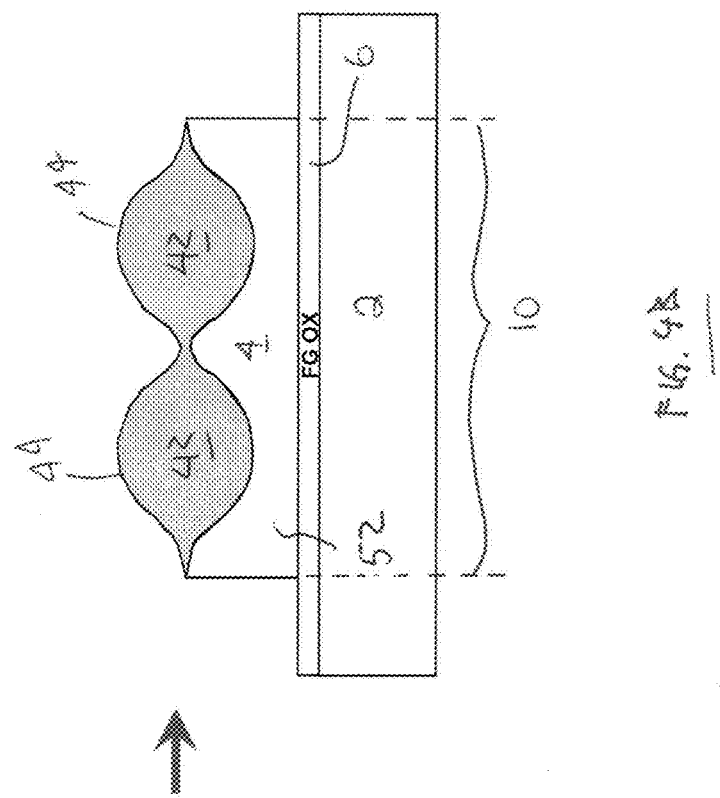
FIGS. 4A and 4B are cross-sectional views illustrating the sequence of processing operations performed on the structure of FIG. 2E according to the exemplary embodiment in which the plug is a nitride or other oxidation resistant material.

FIG. 4A illustrates an exemplary embodiment of the product of a thermal oxidation operation carried out according to the exemplary embodiment in which plug 28, shown in FIG. 2E, is a nitride material or other oxidation resistant material. FIG. 4A shows oxide 42 formed on silicon layer 4 using a thermal oxidation operation that may include various processing parameters and conditions. Plug 28 is drawn as a ghost structure in FIG. 4A to illustrate how plug 28, formed of an oxidation resistant material such as silicon nitride in this illustrated embodiment, influences and shapes the oxidation of silicon layer 4. Oxide 42 includes top surface 44 and includes a shape that is generally bi-convex. FIG. 4A illustrates the embodiment in which plug 28 is formed of nitride or another oxidation resistant material and also illustrates the known bird's-beak phenomena that causes the oxidation to encroach beneath the oxidation resistant plug 28. Due to the bird's beak phenomena, the appropriate sizing of oxide resistant plug 28 and the oxidation conditions; the oxides formed on opposite sides of oxide resistant plug 28 merge under plug 28 to form a continuous oxide layer across the top surface of gate structure 46. The oxidation conditions and time as well as the width of plug 28 may be chosen to ensure that oxide 42, although generally bi-convex in shape, is continuous across the top surface of gate structure 46.

Figure 4B:
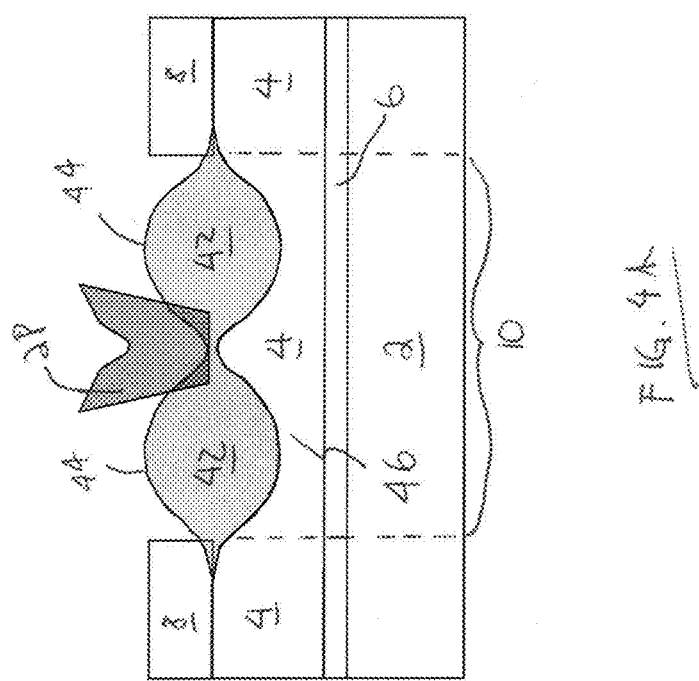

FIG. 4B shows the structure of FIG. 4A after patterned sacrificial layer 8 has been removed. Various suitable selective etching operations are available to remove sacrificial layer 8, and may be used. FIG. 4B also shows that silicon layer 4 has been removed from areas outside floating gate region 10 to produce floating gate electrode 52 with oxide 42 formed thereover. Oxide 42 may serve as an inter-gate dielectric for a floating gate transistor to be formed using the structure shown in FIG. 4B after a control gate is advantageously formed over the structure and further processing operations are carried out.

According to one aspect, the disclosure provides a method for forming a floating gate transistor comprising forming a silicon layer over a substrate and forming a patterned nitride layer over the silicon layer. The patterned nitride layer includes an opening therein defining a floating gate region of a floating gate transistor. The method further comprises forming a plug on the silicon layer in the floating gate region without use of a photomask; and thermally oxidizing According to another aspect, the disclosure provides a method for forming a floating gate transistor comprising: forming a silicon layer over a gate dielectric disposed on a substrate; forming a patterned nitride layer over the silicon layer, the patterned nitride layer including an opening therein defining a floating gate region; forming spacers alongside sides of the patterned nitride layer in said opening; forming a silicon nitride plug between the spacers and on the silicon layer in the floating gate region; removing the spacers to produce a structure with the silicon nitride plug over the silicon layer and the floating gate region; thermally oxidizing; and removing the silicon nitride plug after the thermally oxidizing According to yet another aspect, the disclosure provides a method for forming a floating gate transistor. The method provides for forming a polysilicon layer over a gate dielectric disposed on a substrate; forming a patterned oxidation resistant layer over the polysilicon layer, the patterned oxidation resistant layer including an opening therein defining a floating gate region; and forming spacers alongside sides of the patterned oxidation resistant layer in the opening. The method further provides for forming a polysilicon plug between the spacers and on the polysilicon layer in the floating gate region; removing the spacers to produce a structure with the polysilicon plug over the polysilicon layer in the floating gate region; and thermally oxidizing.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A method for forming a floating gate transistor comprising:
    forming a silicon layer over a substrate;
    forming a patterned nitride layer over said silicon layer, said patterned nitride layer including an opening therein defining a floating gate region of a floating gate transistor;
    forming a plug on a top surface of, and directly contacting said silicon layer in said floating gate region without use of a photomask; and
    thermally oxidizing,
    wherein said plug comprises a silicon plug and said thermally oxidizing comprises oxidizing said silicon plug and said silicon layer in said floating gate region such that an oxide layer is formed and, after said thermal oxidation, silicon thickness in a central portion of said floating gate region is greater than silicon thickness at outer portions of said floating gate region.

2. The method as in claim 1, wherein said plug comprises a self-aligned silicon plug.

3. The method as in claim 1, wherein said forming a plug comprises:
    forming spacers alongside sides of said patterned nitride layer in said opening and over said nitride layer;
    forming said plug between said spacers; and
    removing said spacers to produce a structure with said plug on said silicon layer.

4. The method as in claim 3, wherein said forming spacers comprises forming a blanket film of a TEOS (tetraethyl orthosilicate) film over said patterned nitride layer and over said silicon layer in said opening, then performing an anisotropic etch.

5. The method as in claim 3, further comprising forming a patterned dielectric layer over said patterned nitride layer and prior to said forming spacers, said patterned dielectric layer and said patterned nitride layer having the same pattern.

6. The method as in claim 3, wherein said plug comprises a silicon plug having a height of about 800 to 1200 angstroms.

7. The method as in claim 6, wherein said forming a plug comprises forming a polysilicon layer over said spacers and on said silicon layer in said floating gate area then etching to remove portions of said polysilicon layer other than said plug.

8. The method as in claim 6, wherein said silicon plug is centrally disposed in said floating gate region and includes an average width no greater than about one-third of a width of said floating gate region.

9. A method for forming a floating gate transistor comprising:
    forming a silicon layer over a substrate;
    forming a patterned nitride layer over said silicon layer, said patterned nitride layer including an opening therein defining a floating gate region of a floating gate transistor;
    forming a plug on a top surface of, and directly contacting said silicon layer in said floating gate region without use of a photomask; and
    thermally oxidizing;
    wherein said forming a plug comprises:
    forming spacers alongside sides of said patterned nitride layer in said opening and over said nitride layer;
    forming said plug between said spacers; and
    removing said spacers to produce a structure with said plug on said silicon layer, and, wherein said plug comprises a nitride plug and further comprising removing said plug after said thermally oxidizing.

10. The method as in claim 9, wherein said plug comprises a height of about 800 to 1200 angstroms, is centrally disposed in said floating gate region and includes an average width no greater than about one-third of a width of said floating gate region.

11. The method as in claim 1, wherein said forming a silicon layer comprises forming said silicon layer on a gate dielectric layer disposed on said substrate.

12. A method for forming a floating gate transistor comprising:
    forming a silicon layer over a substrate;
    forming a patterned nitride layer over said silicon layer, said patterned nitride layer including an opening therein defining a floating gate region of a floating gate transistor;
    forming a plug on a top surface of and directly contacting said silicon layer in said floating gate region without use of a photomask; and
    thermally oxidizing, wherein said plug comprises a nitride plug, has a height of about 800 to 1200 angstroms, is centrally disposed in said floating gate region and has a base that includes a width no greater than about one-third of a width of said floating gate region, and wherein said thermally oxidizing and said stripping produces an oxide having an upper surface that is biconvex in shape and extends continuously across said silicon layer in said floating gate region.

13. A method for forming a floating gate transistor comprising:
    forming a silicon layer over a gate dielectric disposed on a substrate;
    forming a patterned nitride layer over said silicon layer, said patterned nitride layer including an opening therein defining a floating gate region;
    forming spacers alongside sides of said patterned nitride layer in said opening;
    forming a silicon nitride plug between said spacers and on said silicon layer in said floating gate region;
    removing said spacers to produce a structure with said silicon nitride plug over said silicon layer and said floating gate region;
    thermally oxidizing said structure including said silicon layer after said removing; and
    removing said silicon nitride plug after said thermally oxidizing.

14. The method as in claim 13, wherein said forming spacers comprises forming a blanket film of a TEOS (tetraethyl orthosilicate) film over said patterned nitride layer and over said silicon layer in said opening, then performing an isotropic etch, and
    further comprising removing portions of said polysilicon layer from regions outside said floating gate region.

15. The method as in claim 14, further comprising forming a patterned TEOS (tetraethyl orthosilicate) layer over said patterned nitride layer and prior to said forming spacers, said patterned TEOS layer and said patterned nitride layer having the same pattern.

16. A method for forming a floating gate transistor comprising:
    forming a polysilicon layer over a gate dielectric disposed on a substrate;
    forming a patterned oxidation resistant layer over said polysilicon layer, said patterned oxidation resistant layer including an opening therein defining a floating gate region;
    forming spacers alongside sides of said patterned oxidation resistant layer in said opening;
    forming a polysilicon plug between said spacers and on and contacting said polysilicon layer in said floating gate region;
    removing said spacers to produce a structure with said polysilicon plug over said polysilicon layer in said floating gate region; and
    thermally oxidizing.

17. The method as in claim 16, further comprising forming a patterned TEOS (tetraethyl orthosilicate) layer over said patterned oxidation resistant layer and prior to said forming spacers, said patterned TEOS layer and said patterned oxidation resistant layer having the same pattern.

18. The method as in claim 16, wherein said forming spacers comprises forming a blanket film of a TEOS (tetraethyl orthosilicate) film over said patterned oxidation resistant layer and over said polysilicon layer in said opening, then performing an isotropic etch, and
    further comprising removing portions of said polysilicon layer from regions outside said floating gate region.

* * * * *